United States Patent
Lee et al.

(10) Patent No.: US 7,169,653 B2
(45) Date of Patent: Jan. 30, 2007

(54) FABRICATION METHOD FOR LIQUID CRYSTAL DISPLAY

(75) Inventors: Shih-Wei Lee, Kaohsiung (TW); Shou-Jen Chang, Hsinchu (TW); Yen-Wen Fang, Miaoli (TW)

(73) Assignee: Hannstar Display Corp., Taipei (TW)

( * ) Notice: Subject to any disclaimer, the term of this patent is extended or adjusted under 35 U.S.C. 154(b) by 40 days.

(21) Appl. No.: 11/033,893

(22) Filed: Jan. 13, 2005

(65) Prior Publication Data

US 2005/0158900 A1 Jul. 21, 2005

(30) Foreign Application Priority Data

Jan. 16, 2004 (TW) .............................. 93101149 A

(51) Int. Cl.
*H01L 21/00* (2006.01)
*H01L 21/336* (2006.01)

(52) U.S. Cl. ...................... 438/149; 438/158; 438/197

(58) Field of Classification Search ................ 438/149, 438/151, 152, 158, 197; 257/213, 252, 586
See application file for complete search history.

(56) References Cited

U.S. PATENT DOCUMENTS

2002/0100974 A1* 8/2002 Uchiyama .................... 257/737
2004/0185683 A1* 9/2004 Nakamura ................... 438/957

* cited by examiner

*Primary Examiner*—Hsien-Ming Lee
(74) *Attorney, Agent, or Firm*—Rabin & Berdo, P.C.

(57) ABSTRACT

A method of fabricating a liquid crystal display panel is provided, which comprises the steps of providing a substrate; forming a mask layer over the substrate, wherein the mask layer has a reverse-tapered opening exposing a predetermined conductive line area; depositing a metal layer on the substrate within the predetermined conductive line area to form a conductive line with a tapered sidewall by performing an anisotropic deposition process; and removing the mask.

19 Claims, 4 Drawing Sheets

FABRICATION METHOD FOR LIQUID CRYSTAL DISPLAY

BACKGROUND OF THE INVENTION

1. Field of the Invention

The present invention relates to a method of fabricating a liquid crystal display panel, and in particular to a method of forming conductive lines on a liquid crystal display substrate.

2. Description of the Related Art

Liquid crystal displays (LCDs) have gained widespread acceptance in the flat panel display market. Images are displayed by exploiting the photoelectric properties of liquid crystal layer, resulting from the arrangement conversion of liquid crystal upon being subjected to an external electric field, due to the dielectric anisotropy and conductive anisotropy of liquid crystal.

The panel structure of a LCD typically comprises two laminated substrates with a gap therebetween, and liquid crystal injected into the gap. Corresponding electrodes on each substrate control the direction and arrangement of liquid crystal molecules.

Currently, the development trend of flat panel display is toward large screen displays. Conventional development techniques for large screen LCDs, however, are hindered by several disadvantages.

When the size of a LCD panel increases, the length of the gate electrode of a LCD panel must be correspondingly increased in order to provide high resolution and uniform display characteristics. First among the disadvantages is that as gate electrode length increases, the R/C time delay also increases. The gate electrode material severely slows down the propagation of the signal.

Currently, in the manufacturing process, aluminum is utilized as a gate electrode material. As the length of the aluminum electrode increases, the R/C time delay increases correspondingly as well. Thus, reducing R/C time delay in a gate electrode is a critical consideration in the development of large screen LCDs.

One solution to the above-mentioned problem is to replace aluminum with a low-resistance material, such as copper. The resistance of copper is about half of that of aluminum. The use of copper as gate electrodes reduces R/C time delay; however, process compatibility issues arise when copper is introduced to replace aluminum in the conventional LCD fabrication process. That is, problems similar to those that arise in the copper interconnect process in semiconductor fabrication also occur.

Etching copper is more complicated than etching aluminum. Currently no effective etching recipe (including etching liquids, etching parameters, and the like) which can adequately etch copper is available. Therefore, it is difficult to fabricate a copper gate electrode with conventional methods such as physical vapor deposition and microlithography.

Copper-deposition-related processes mainly require a copper surface planarization technique, such as chemical mechanical polishing (CMP). If the LCD fabrication process comprises copper layer deposition and copper layer patterning to produce copper gate electrodes, the entire copper layer surface must be planarized before patterning. Achieving uniform planarization by CMP is extremely difficult in large size LCDs due to large polishing area, and, as a result, the yield of subsequent processes may be reduced. Consequently, the CMP uniformity requirement is relatively stringent.

Furthermore, the gate electrodes for an LCD typically require tapered sidewalls, and the angle between the sidewall and the substrate is preferably about 20 to 40 degrees for subsequent processes. FIG. 1 shows a cross section of an aluminum gate electrode having a tapered sidewall with an angle of about 21.75 degrees which may form naturally during etching of an aluminum layer. Hence, when copper is substituted for aluminum, the angle of about 20 to 40 must be maintained in the copper gate electrode to ensure the reliability of subsequent process.

SUMMARY OF THE INVENTION

Accordingly, the object of the invention is to provide a fabrication method for a liquid crystal display panel and a fabrication method for a liquid crystal display utilizing the same, for reducing R/C time delay to enhance the operation and display quality in large screen LCDs.

To achieve the object, the present invention provides a fabrication method for a liquid crystal display panel and a fabrication method for a liquid crystal display utilizing the same, wherein a gate metal may be deposited directly on a substrate using a patterned mask layer as a mask, and omitting subsequent steps of gate metal etching and polishing. When the method of the present invention is applied to a copper gate electrode process, R/C time delay caused by gate electrode material can be effectively reduced without requiring a special etching recipe, and inadequate yield due to poor polishing can be prevented.

Additionally, in the methods, the design of the opening of the hollow region of the mask pattern exhibits a geometric space with a relatively narrow top and a relatively wide bottom, that is, a reverse-tapered opening. The deposition of a metal layer on the LCD substrate is performed using a deposition with relatively poor step coverage and relatively high directionality. By designing the opening to have a narrow top and a wide bottom, the deposited metal in the vicinity of the top of the reverse-tapered opening forms an overhang structure. This structure, in turn, hinders the metal from further depositing on the corresponding bottom of the reverse-tapered opening, and, thus, the conductive line deposited on the bottom of the opening also has tapered sidewalls. The degree of the angle between the tapered sidewall and the panel substrate is not limited in the present invention and may be varied as desired.

The present invention provides a method for fabricating a LCD substrate, comprising the steps of providing a panel containing at least one predetermined conductive line area; forming a mask layer over the substrate, wherein the mask layer has a reverse-tapered opening correspondingly disposed above the predetermined conductive line area of the substrate; depositing a metal layer on the substrate, such that the top of the mask layer and the predetermined conductive line area on the bottom of the reverse-tapered opening are covered with the metal layer and the metal layer on the predetermined conductive line area is formed as a conductive line with tapered sidewalls due to the overhang structure; and removing the mask layer while retaining the conductive line with tapered sidewalls on the predetermined conductive line area.

Furthermore, according to the present invention, a method for fabricating a LCD is also provided. The method comprises the steps of providing a first substrate containing at least one predetermined conductive line area; forming a mask layer over the first substrate, wherein the mask layer has a reverse-tapered opening correspondingly disposed above the predetermined conductive line area of the first substrate; depositing a metal layer on the first substrate, such that the top of the mask layer and the predetermined conductive line area on the bottom of the reverse-tapered opening are covered with the metal layer and the metal layer on the predetermined conductive line area is formed as a conductive line with tapered sidewalls; removing the mask layer while retaining the conductive line with tapered sidewalls on the predetermined conductive line area; forming a thin film transistor (TAT) array on the first substrate, wherein a plurality of pixel areas are defined in the thin film transistor array; arranging a color filter corresponding to the pixel areas; arranging a second substrate above the first substrate separated by a predetermined distance; laminating the first substrate to the second substrate and disposing a liquid crystal layer between the first and second substrates.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A detailed description is given in the following embodiments with reference to the accompanying drawings.

In the present invention, a TFT LCD is fabricated. The TFT LCD comprises a TFT array substrate and a color filter substrate. Since the color filter substrate can be provided by any conventional color filter process, description thereof is omitted here.

Figure 1:
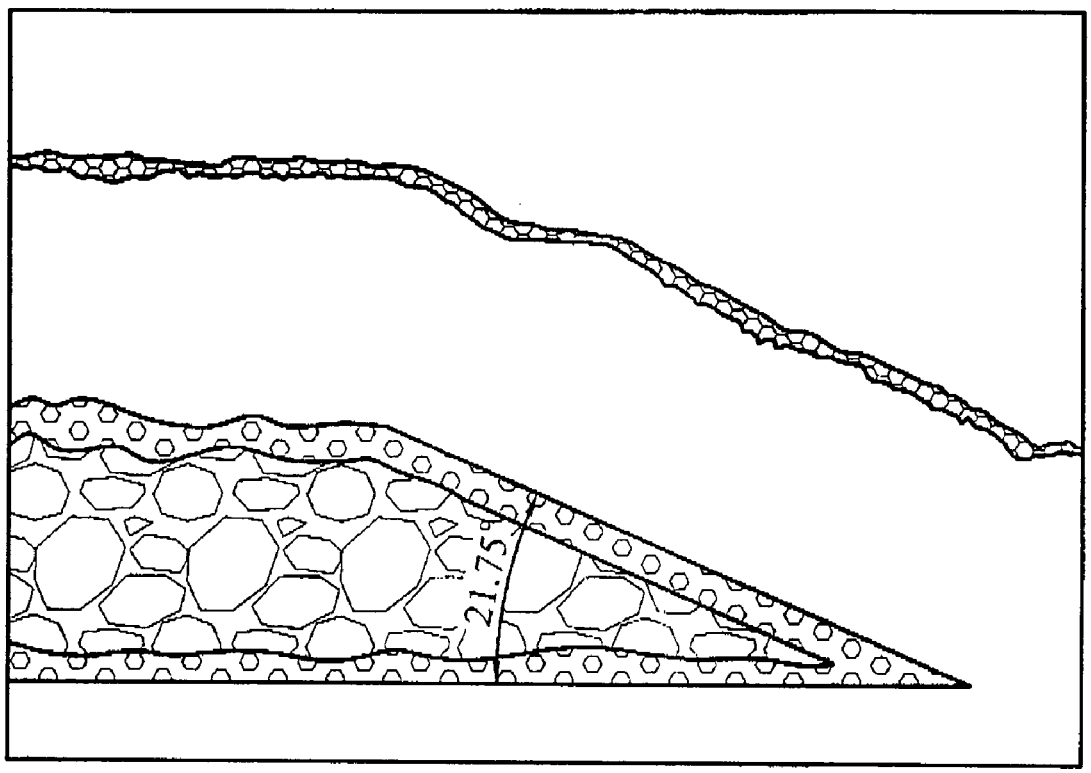
FIG. 1 is a schematic cross section of an aluminum gate electrode in a conventional LCD panel.
Figure 2A:
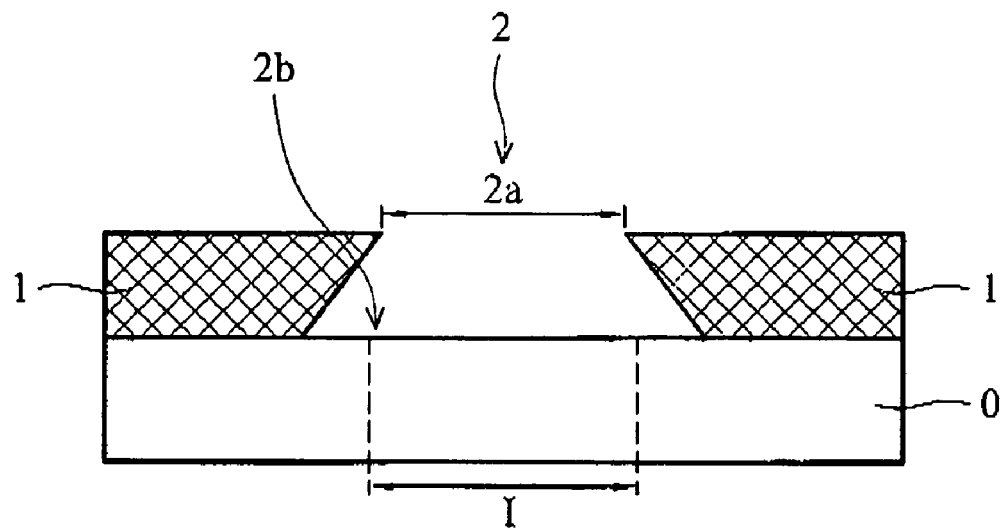
FIGS. 2A through 2D are schematic cross sections of the process for fabricating a copper gate electrode of TFT-LCD substrate of the present invention.

Referring to FIG. 2A, first, a substrate 0 is provided, which comprises a predetermined gate electrode area I. The substrate may comprise glass or light-transmissive plastic. The light-transmissive plastic may be polyethyleneterephthalate, polyester, polycarbonates, polyacrylates or polystyrene.

A mask layer 1 is formed on the substrate 0. The mask layer may be, for example a photoresist layer, preferably, a negative photoresist layer. In this embodiment, a negative photoresist layer is used. After soft baking and exposure of the pattern, the negative photoresist layer is cured by cross-linking. A development process is then performed to remove the predetermined gate electrode area I of the substrate 0. According to the properties of a negative photoresist layer, a reversed-tapered opening 2 having a relatively narrow top 2a and a relatively wide bottom 2b is formed.

Figure 2B:
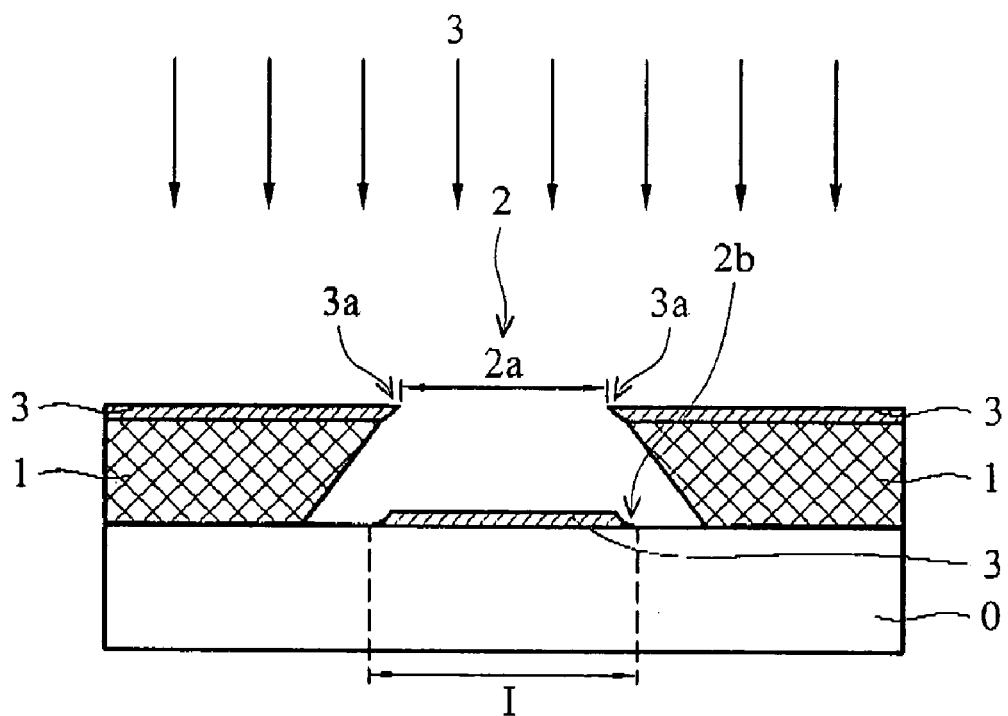

Next, referring to FIG. 2B, before depositing a metal layer, a barrier layer 3 is preferably deposited by PVD, such as vacuum deposition, ion plating, ion beam deposition, a cluster ion beam method or the like, over the substrate 0 covering the top surface of the mask layer 1 and also the predetermined gate electrode area I of the reversed-tapered opening bottom 2b due to the deposited barrier material passing through the reversed-tapered opening top 2a. The barrier layer 3 may comprise, for example, tungsten nitride, titanium nitride, tungsten nitride, or tantalum nitride. Because PVD has high directionality and relatively poor step coverage when compared with chemical vapor deposition, it is suitable for deposition of the barrier layer and forms a slight overhang 3a in the vicinity of the narrower reversed-tapered opening top 2a.

Figure 2C:
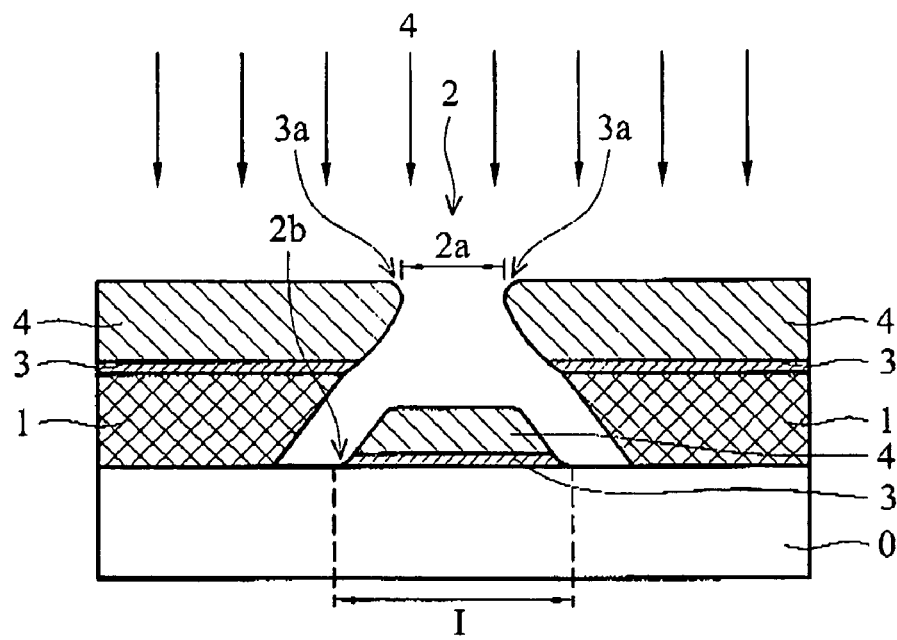

Then, referring to FIG. 2C, a metal layer 4 is deposited over the substrate 0 by PVD, such as vacuum deposition, ion plating, ion beam deposition, a cluster ion beam method or the like, to cover the top surface of the barrier layer 3 and also the top surface of the barrier layer 3 on the predetermined gate electrode area I of the reversed-tapered opening bottom 2b due to the deposition of metal passing through the reversed-tapered opening top 2a. Again, because PVD has high directionality and has relative poor step coverage when compared with chemical vapor deposition, the deposited overhang 3a of the metal layer 4 is gradually enlarged and at the same time the reversed-tapered opening top 2a is gradually narrowed. Thus, the deposition area of the metal layer 4 on the corresponding predetermined gate electrode area I is gradually decreased, causing the sidewalls of the metal layer 4 to exhibit a tapered shape. The metal layer may comprise, for example, copper.

Figure 2D:
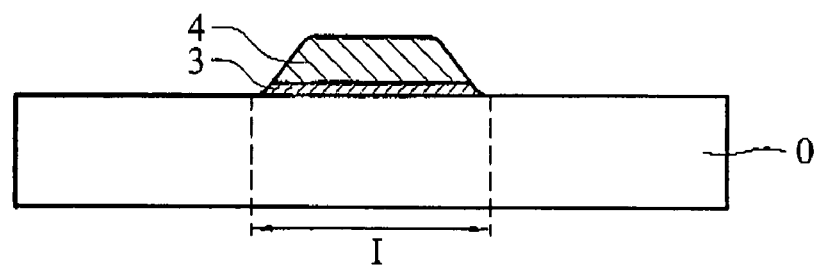

Then, referring to FIG. 2D, the mask layer 1 on the substrate 0 is removed, leaving a metal layer 4 with tapered sidewalls as mentioned above on the predetermined gate electrode area I of the substrate 0 to serve as a gate line of the gate electrode of a TFT LCD.

According to the feature of the present invention, a conductive line may be obtained using the same method for fabricating the gate line as described above. The conductive line may be a gate line, data line, or common line.

Figure 3:
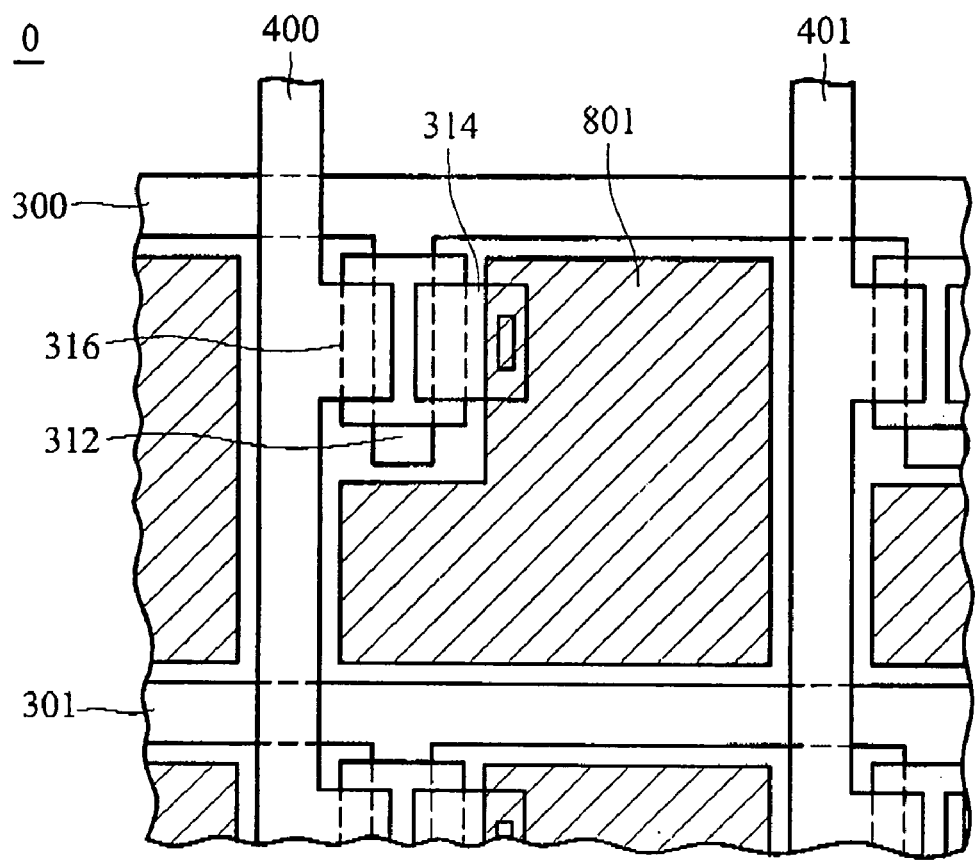
FIG. 3 is a top view of the thin film transistor array substrate of the present invention.

FIG. 3 shows a completed TFT array substrate 0 comprising the above-mentioned metal layer 4 with tapered sidewalls as gate lines 300, 301, data lines 400, 401, source electrode 316, drain electrode 314, and pixel electrode 801. The TFT array may comprise an amorphous silicon or polysilicon TFT.

Then, the alignment and lamination of the color filter substrate 0' and TFT array substrate 0 is performed using a conventional LCD panel manufacturing process.

Figure 4:
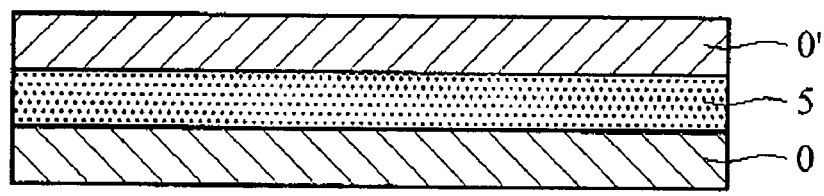
FIG. 4 is a schematic cross section of the LCD panel of the present invention.

Finally, liquid crystal 5 is injected into the gap between the color filter substrate 0' and TFT array substrate 0 by a conventional vacuum injection process, and then sealed to complete the LCD panel of the embodiment according to the present invention. FIG. 4 shows a schematic cross section thereof. Alternatively, liquid crystal 5 in a necessary amount is dropped on the surface of the color filter substrate 0' or TFT array substrate 0 by one drop fill (ODF) process, and subsequently the two substrates are combined and sealed to complete a LCD panel.

The TFT array substrate 0 utilizes a copper layer as gate lines 300, 301, and a gate electrode structure 312, therefore the R/C time delay due to the conventional aluminum gate electrode is greatly reduced and in turn the operation and display quality of large screen LCD is enhanced.

In the fabrication method of the present invention, a copper layer serving as the metal layer 4 is directly deposited to form gate lines 300, 301 and gate electrode 312 on the substrate 0 by using a negative photoresist layer pattern as a mask, omitting steps of gate metal etching and polishing required in the conventional process. Therefore, the R/C time delay caused by gate electrode material is reduced, an etching step and a special etching recipe are not required, and inadequate yield due to poor polishing can be prevented.

Furthermore, the present invention is not limited to the fabrication of gate electrodes 300, 301, 302. Other conductive lines on LCD substrates, such as data lines 400, 401, common lines (not shown) may be fabricated using the method of the present invention. In the fabrication methods for a liquid crystal display substrate and a fabrication method for a liquid crystal display according to the present invention, a metal layer 4 is directly deposited on a substrate 0 to form conductive lines which may be gate lines or electrodes 300, 301, 312, data lines 400, 401, or common lines, using a negative photoresist layer pattern as a mask, the design of the reverse-tapered opening 2 of the hollow region of the negative photoresist layer exhibits a geometric space with a narrow top 2a and a wide bottom 2b, and the deposition of the copper layer on the substrate 0 is performed using a deposition with relatively poor step coverage and relatively high directionality. An overhang structure 3a is formed in the vicinity of the opening top 2a by the design of the reverse-tapered opening 2 having a narrow top 2a and a wide bottom 2b when the metal layer 4 is deposited. Thus, as the top 2a of the reverse-tapered opening is gradually narrowed, the metal passing through the opening top 2a and depositing on the opening bottom 2b forms the metal layer 4 with tapered sidewalls ensuring the reliability of subsequent manufacturing processes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a liquid crystal display panel, comprising the steps of:
    providing a substrate;
    forming a mask layer over the substrate, wherein the mask layer has a reverse-tapered opening exposing a predetermined conductive line area;
    depositing a metal layer on the mask layer having a reverse-tapered opening with a top opening narrower than a base opening and the metal layer having an upper portion narrower than a base portion on the substrate within the predetermined conductive line area to form a conductive line with a tapered sidewall by performing an anisotropic deposition process; and
    removing the mask layer.

2. The method as claimed in claim 1, wherein the metal layer is formed by physical vapor deposition.

3. The method as claimed in claim 1, wherein the metal layer comprises copper.

4. A method of fabricating a liquid crystal display panel, comprising the steps of:
    providing a substrate;
    forming a mask layer over the substrate, wherein the mask layer has a reverse-tapered opening exposing a predetermined conductive line area;
    forming a barrier layer on the substrate to cover the predetermined conductive line area on the bottom of the reverse-tapered opening;
    depositing a metal layer on the mask layer having a reverse-tapered opening with a top opening narrower than a base opening and the metal layer having an upper portion narrower than a base portion on the substrate within the predetermined conductive line area to form a conductive line with a tapered sidewall by performing an anisotropic deposition process; and
    removing the mask layer.

5. The method as claimed in claim 4, wherein the barrier layer is formed by physical vapor deposition.

6. The method as claimed in claim 4, wherein the barrier layer comprises titanium nitride, tungsten nitride, or tantalum nitride.

7. The method as claimed in claim 1, wherein the mask layer is a photoresist layer.

8. The method as claimed in claim 7, wherein the mask layer is a negative photoresist layer.

9. The method as claimed in claim 1, wherein the conductive line comprises a gate line, a data line, or a common line.

10. A method of fabricating a liquid crystal display, comprising the steps of:
    providing a first substrate;
    forming a mask layer over the first substrate, wherein the mask layer has a reverse-tapered opening exposing a predetermined conductive line area;
    depositing a metal layer on the first substrate within the predetermined conductive line area to form a conductive line with a tapered sidewall by performing an anisotropic deposition process;
    removing the mask layer;
    forming a thin film transistor array on the first substrate, wherein a plurality of pixel areas are defined in the thin film transistor array;
    arranging a color filter corresponding to the pixel areas;
    arranging a second substrate above the first substrate separated by a predetermined distance; and
    bonding the first substrate to the second substrate and disposing a liquid crystal layer between the first and second substrates.

11. The method as claimed in claim 10, wherein the metal layer is formed by physical vapor deposition.

12. The method as claimed in claim 10, wherein the metal layer comprises copper.

13. The method as claimed in claim 10, further comprising the step of, before depositing the metal layer, forming a barrier layer on the first substrate to cover the predetermined conductive line area on the bottom of the reverse-tapered opening.

14. The method as claimed in claim 13, wherein the barrier layer is formed by physical vapor deposition.

15. The method as claimed in claim 13, wherein the barrier layer comprises titanium nitride, tungsten nitride, or tantalum nitride.

16. The method as claimed in claim 10, wherein the mask layer is a photoresist layer.

17. The method as claimed in claim 16, wherein the mask layer is a negative photoresist layer.

18. The method as claimed in claim 10, wherein the thin film transistor array comprises an amorphous silicon or polysilicon thin film transistor.

19. The method as claimed in claim 10, wherein the conductive line comprises a gate line, a data line, or a common line.

* * * * *